US005821028A

United States Patent [19]

Maejima et al.

[11] Patent Number: 5,821,028

[45] Date of Patent: Oct. 13, 1998

[54] THERMAL TRANSFER IMAGE RECEIVING MATERIAL WITH BACKCOAT

[75] Inventors: Katsumi Maejima; Tomoko Takeyama; Atsushi Nakajima; Katsuyuki Takeda, all of Hino, Japan

[73] Assignee: Konica Corporation, Tokyo, Japan

[21] Appl. No.: 832,978

[22] Filed: Apr. 4, 1997

[30] Foreign Application Priority Data

Apr. 12, 1996 [JP] Japan .................................... 8-091067

[51] Int. Cl.[6] ................................ G03C 8/52; G03F 7/11

[52] U.S. Cl. .......................... 430/201; 430/200; 430/207; 430/950; 503/227

[58] Field of Search .................................... 430/200, 201, 430/207, 950; 503/227

[56] References Cited

U.S. PATENT DOCUMENTS

| | | | |
|---|---|---|---|
| 4,868,088 | 9/1989 | Aono et al. | 430/207 |
| 5,252,535 | 10/1993 | Martin et al. | 503/227 |
| 5,501,937 | 3/1996 | Matsumoto et al. | 430/200 |
| 5,580,693 | 12/1996 | Nakajima et al. | 430/200 |

FOREIGN PATENT DOCUMENTS

| | | |
|---|---|---|
| 0 409 526 | 1/1991 | European Pat. Off. . |
| 0 574 055 | 12/1993 | European Pat. Off. . |
| 0 703 091 | 3/1996 | European Pat. Off. . |

*Primary Examiner*—Richard L. Schilling

*Attorney, Agent, or Firm*—Frishauf , Holtz, Goodman, Langer & Chick, P.C.

[57] ABSTRACT

A thermal transfer image receiving material is disclosed which comprises a support having a first surface and a second surface, a cushion layer and an image receiving layer provided on the first surface in that order, and a back coat layer provided on the second surface, wherein the surface of the back coat layer has a suction pressure of 300 mmHg or more.

12 Claims, 1 Drawing Sheet

THERMAL TRANSFER IMAGE RECEIVING MATERIAL WITH BACKCOAT

FIELD OF THE INVENTION

The present invention relates to a thermal image receiving material, and particularly to a thermal image receiving material which does not cause image defect due to foreign matter adherence and improves anti-static property.

BACKGROUND OF THE INVENTION

As a conventional thermal image transfer technique there is a method comprising bringing a recording material having on a substrate a layer containing a heat fusible or heat sublimable dye in close contact with an image receiving material, and applying pressure from the recording material by means of a thermal head or an electric head controlled by an electric signal to transfer an image to the image receiving material.

Thermal transfer recording has advantages such as no noise, maintenance-free, low cost, ease of color image formation and digital recording capability, and is applied in various fields such as printers, recorders, facsimile and computer terminals.

Technique of printers employing a thermal head has been markedly progressed. As a printing method giving high resolution image and enabling variable contrast recording with area contrast alone, there is proposed a sub-scanning separation method disclosed in Japanese Patent O.P.I. Publication Nos. 4-19163 and 5-155057 or a heat assembling method disclosed in "Denshishashin Gakkai Nenjitaikai 1992/7/6 Yokoshu".

Recently, in the medical or printing fields requiring a high resolution image, there is proposed a dry recording method employing a high-power light source such as a laser. The example is disclosed in Japanese Patent O.P.I. Publication No. 59-143659.

However, all recording techniques have had problems in image transfer failure caused by the presence of fine foreign matter in image recording. The example is disclosed in Japanese Patent O.P.I. Publication No. 59-143659. In a conventional heat fusible thermal transfer recording method, a colorant layer of a recording material has a thickness of 2 μm or more and low melt viscosity, and therefore, the foreign matter between the recording material and the image receiving material is covered with the melted colorant layer and causes no problem. In contrast, in a thin layer thermal transfer recording method using a thin colorant layer, the foreign matter between the recording material and the image receiving material causes apparent image transfer failure resulting in a serious problem.

In Japanese Patent O.P.I. Publication No. 5-169861 is disclosed a heat mode thermal transfer recording method which minimizes image defects caused by foreign matter between the materials by employing a support having a cushion property, a recording material having a cushion layer or an image receiving material having a cushion layer. However, the patent does not disclose a method which minimizes image defects caused by foreign matter adhering to the back coat layer of the image receiving material.

In Japanese Patent O.P.I. Publication No. 7-61123 is disclosed a method employing a back coat layer having a cushion property in order to minimize image defects caused by the foreign matter between the recording material and the image receiving material foreign matter adhering to the back coat layer of the image receiving material. However, the back coat layer having a cushion property had not only a problem in manufacture of low productivity but also a problem in that major image defects are occasionally caused by the foreign matter between the recording material and the image receiving material. Further, since the back coat layer has a cushion property, transporting failure in a recording apparatus or blocking during storage is likely to occur.

In that patent is disclosed a back coat layer having 1 to 3,000/mm$^2$ of protrusions with a height of 10 μm or more in order to minimize any adverse effects caused by the foreign matter between the back coat layer and a drum. However, the disclosed back coat layer occasionally resulted in image fog or transfer defects due to the protrusions higher than the average height in recording while the image receiving material closely contacts the image recording material.

In Japanese Patent O.P.I. Publication No. 8-11444 is disclosed a method employing a thermal transfer image receiving material comprising a support and provided thereon, a dye receiving layer and a back coat resin layer on the surface of the support opposite the dye receiving layer, the back coat resin layer having a center line roughness Ra of 0.5 to 2.5 μm and protrusions of 2,000 to 4,000/mm$^2$ in order to minimize curling or slipping property of the back coat layer. However, the back coat layer was insufficient as a back coat layer of an image receiving material receiving a heat fusible colorant layer.

Minimizing foreign matter adherence to an image receiving material due to electrical charges is effective for reducing foreign matter between the image receiving material and the drum.

In Japanese Patent O.P.I. Publication No. 7-10701 is disclosed a light heat converting heat mode image receiving material comprising a cushion layer containing an anti-static agent. The charging level is characterized in that the colorant layer surface charge is −100 to 100 V, 1 second after the surface is charged according to FTMS 101C Method 4046.1 Oct. 8th. 1982, Change Notice (FTMS-4046).

However, the experimental results did not sufficiently minimize the surface charge generated during transporting in a recording apparatus. Further, coatability or surface shape of the cushion layer deteriorated, and therefore, there is a limitation to material used in the cushion layer.

SUMMARY OF THE INVENTION

The present invention has been made in view of the above mentioned. An object of the invention is to provide a thermal transfer image receiving material free from image defects caused by foreign matter. Another object of the invention is to provide a thermal transfer image receiving material suitable particularly for a heat mode image recording method recording an image while the recording material is in close contact with the image receiving material.

DETAILED DESCRIPTION OF THE INVENTION

Figure 1:
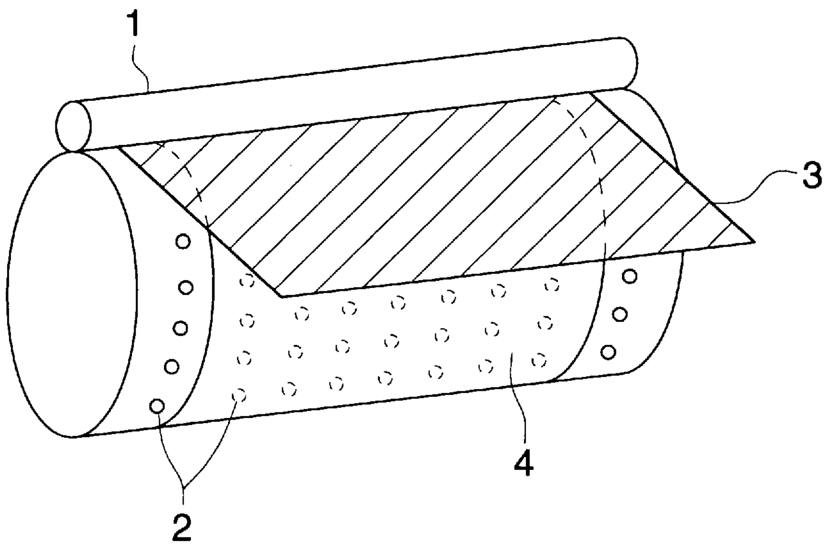
FIG. 1 shows a perspective view in which a thermal transfer image receiving material is superposed on a recording material on a suction drum.

The present inventors have made an extensive study and found that a back coat layer surface of a thermal transfer image receiving material having a suction pressure of 300 mmHg or more minimizes various image defects caused by the presence of foreign matter during recording. Further, the present inventors have found that the back coat layer, which is comprised of a binder and a matting agent whose average particle size or particle size distribution is adjusted, can bring an image receiving material in close contact with a recording material in a heat mode recording carried out while the image receiving material contacts the recording material and minimizes image defects occurring during recording.

Further, the present inventors have found that the back coat layer further containing an anti-static agent and having a surface specific resistance of $2\times10^9$ $\Omega/cm^2$ or less can minimize frictional electrification caused by various materials while transporting.

The above object of the invention can be attained by the following constitution:

1. A thermal transfer image receiving material comprising:

a support having a first surface and a second surface;

a cushion layer and an image receiving layer provided on the first surface in that order; and a back coat layer provided on the second surface, wherein the surface of the back coat layer has a suction pressure of 300 mmHg or more, 2. The thermal transfer image receiving material of 1 above, wherein the back coat layer contains a binder resin and a matting agent, 3. The thermal transfer image receiving material of 2 above, wherein the number average particle size of the matting agent is not less than 2.5 $\mu$m larger than the thickness of the back coat layer containing only a binder resin, 4. The thermal transfer image receiving material of 2 or 3 above, wherein the back coat layer contains a matting agent having a particle size of 8 $\mu$m or more in an amount of 5 $mg/m^2$ or more, 5. The thermal transfer image receiving material of 2, 3 or 4 above, wherein the matting agent has $\sigma/r_n$ of 0.3 or less, $\sigma$ representing standard deviation of the matting agent particle size and $r_n$ the number average particle size of the matting agent, 6. The thermal transfer image receiving material of 1, 2, 3, 4 or 5 above, wherein the surface specific resistance of the back coat layer is $2\times10^9$ $\Omega/cm^2$ or less, 7. The thermal transfer image receiving material of 6 above, wherein the back coat layer contains carbon black and a metal oxide, 8. The thermal transfer image receiving material of 1, 2, 3, 4, 5, 6 or 7 above, wherein the softening point of the cushion layer and image receiving layer is 70° C. or less, the softening point being measured according to a TMA method, 9. The thermal transfer image receiving material of 1, 2, 3, 4, 5, 6, 7 or 8 above, wherein the image receiving layer contains a matting agent, 10. The thermal transfer image receiving material of 9 above, wherein the number average particle size of the matting agent contained in the image receiving layer is 1.5 to 5.5 $\mu$m larger than the average thickness of portions containing no matting agent in the image receiving layer, 11. The thermal transfer image receiving material of 9 or 10 above, wherein the image receiving layer contains the matting agent in an amount of 0.02 to 0.2 $g/m^2$, 12. The thermal transfer image receiving material of 1, 2, 3, 4, 5, 6, 7, 8, 9, 10 or 11 above, wherein the binder thickness of the image receiving layer is 0.8 to 2.5 $\mu$m, 13. The thermal transfer image receiving material of 1, 2, 3, 4, 5, 6, 7, 8, 9, 10, 11 or 12 above, wherein the image receiving layer receives an image from a heat mode recording material comprising a support and provided thereon, a light-heat converting layer and a colorant layer, 14. A heat mode recording method comprising the steps of:

bringing the image receiving layer of the thermal transfer image receiving material of 1, 2, 3, 4, 5, 6, 7, 8, 9, 10, 11, 12 or 13 above in contact with a colorant layer of a heat mode recording material comprising a support and provided thereon, a light-heat converting layer and the colorant layer; and imagewise exposing to light the resulting material from the support side of the recording material to transfer an image onto the image receiving layer, or 15. A heat mode recording method of 14 above, comprising the steps of:

carrying the image receiving material on a carrying member having suction holes by suction through the suction holes;

bringing the image receiving layer of the image receiving material in contact with the colorant layer of the heat mode recording material comprising a support and provided thereon, a light-heat converting layer and the colorant layer, the heat mode recording material being a size larger than the image receiving material;

bringing the image receiving layer in close contact with the colorant layer by suction through the suction holes; and then imagewise exposing to light the resulting material from the support side of the recording material to form an image.

Next, the image receiving material and recording material will be explained.

<Image receiving material>

The image receiving material of the invention is comprised of a support having a first surface and a second surface, a cushion layer and an image receiving layer provided on the first surface in that order, and a back coat layer on the second surface.

The support may be any support, as long as it has excellent dimensional stability and heat resistance in forming an image. As the support is used, for example, a film or sheet disclosed on page 2, lower left column, lines 12 to 18 of Japanese Patent O.P.I. Publication No. 63-193886. The support has preferably stiffness or flexibility suitable for transport. The thickness of the support is preferably 25 to 200 $\mu$m, and more preferably 50 to 125 $\mu$m.

In the invention, the suction pressure of the back coat layer surface is obtained by the following method:

(a) after the back coat layer is provided, the layer is subjected to embossing treatment whereby the surface is roughened, (b) the back coat layer surface is roughened by incorporation of a matting agent to the back coat layer, or (c) the back coat layer is provided on the roughened surface of the support, the protruded portions of the roughened surface protruding the back coat layer.

Particularly in a heat transfer recording method requiring a precise image, a film or sheet having a smooth surface is preferably used as the support, and therefore, the necessary surface suction pressure is obtained preferably by method (2).

The suction pressure of the back coat layer surface can be measured through a smoothter SM-6B (produced by Toei Denkikogyo Co., Ltd.)

The binder used in the back coat layer includes a polymer such as gelatin, polyvinyl alcohol, methylcellulose, nitrocellulose, acetylcellulose, an aromatic polyamide resin, a silicone resin, an epoxy resin, an alkyd resin, a phenol resin, a melamine resin, a fluorine-containing resin, a polyimide resin, a polyurethane resin, an acryl resin, a urethane modified silicone resin, a polyethylene resin, a polypropylene resin, a teflon resin, a polyvinyl butyral resin, a polyvinyl chloride resin, polyvinyl acetate, polycarbonate, an aromatic polyester, a fluorinated polyurethane or polyether sulfone.

It is effective for prevention of separation of the matting agent from the back coat layer or improved anti-scratch of the back coat layer to use a cross-linkable water soluble binder in the back coat layer and cross-link the binder. It is also effective for blocking during storage.

According to characteristics of a cross-linking agent used, the cross-linking is carried out by heat, an active ray, pressure or its combination but with no special limitations. An adhesive layer may be provided between the back coat layer and the support to give an adhesion property to the support.

The matting agent preferably used in the back coat layer includes organic or inorganic fine particles. The organic matting agent includes fine particles such as polymethyl methacrylate (PMMA), polystyrene, polyethylene, polypropylene or other radical polymerization polymers and polycondensation polymer fine particles such as polyesters and polycarbonates.

The coating weight of the back coat layer is preferably 0.5 to 3 $g/m^2$.

The number average particle size of the matting agent is preferably 2.5 $\mu$m or more, and more preferably 2.5 to 20 $\mu$m, larger than the thickness of the back coat layer containing only a binder resin. The back coat layer containing a matting agent having a particle size of 8 $\mu$m or more in an amount of 5 $mg/m^2$, preferably 6 to 600 $mg/m^2$ minimizes foreign matter problems. It has been proved that the matting agent having a value obtained by dividing standard deviation by the number average particle size, ($\sigma/r_n$ (variation coefficient of particle size) of 0.3 or less, which has a narrow particle size distribution, solves a problem which occurs is caused by a matting agent of too large particle size and further can attain an intended object in a small amount. The variation coefficient is more preferably 0.15 or less.

The back coat layer preferably contains an anti-static agent in order to prevent foreign matter adherence due to frictional electrification caused during contact with a transport roller. The anti-static agent includes a cationic, anionic or nonionic surfactant, a polymer anti-static agent, conductive fine particles and compounds described on pages 875 and 876 of "11290 Kagaku Shohin", Kagakukogyo Nipposha.

An anti-static agent preferably used in the back coat includes conductive fine particles such as carbon black, metal oxides, for example, zinc oxide, titanium oxide, or tin oxide, and organic semiconductors. particularly, the conductive fine particles are free from separation from the layer and gives a stable anti-static effect independent of ambient atmosphere.

The back coat layer may contain various surfactants, silicone oil or a fluorine-containing resin in order to have a releasing or coating property.

The back coat layer in the invention preferably has a softening point of 70° C. or less, the softening point being measured according to a TMA (Thermo Mechanical Analysis) method.

The TMA softening point is measured by heating a sample at a constant temperature elevating speed while applying a constant load to the sample and then observing the sample phase. In the invention, a temperature at which the sample phase begins varying is defined as a TMA softening point. The measurement of a softening point according to TMA can be conducted employing Thermoflex made by Rigaku Denki Co. Ltd.

The cushion layer used in the image receiving material of the invention is a layer having a cushion property. Elastic modulus or penetration can be employed as a measure of the cushion property herein referred to. The cushion layer having, for example, an elastic modulus of 1 to 250 $kg/mm^2$ or a penetration of 15 to 500, exhibits an excellent cushion property in forming a color proof image, but the desired cushion degree varies due to an intended use of the image. The penetration herein referred to is determined by JIS K2530-1976. The TMA softening point of the cushion layer is preferably 70° C. or less, and more preferably 60° C. or less.

The preferable properties of the cushion layer is not necessarily determined by kinds of resins used, but the preferable resins include an ethylene-vinyl acetate copolymer, an ethylene-ethyl acrylate copolymer, a polybutadiene resin, a styrene-butadiene copolymer (SBR), a styrene-ethylene-butene-styrene copolymer (SBES), an acrylonitrile-butadiene copolymer (NBR), a polyisoprene copolymer (IR), a styrene-isoprene copolymer (SIS), an acrylate copolymer, a polyester resin, a polyurethane resin, an acryl resin, a butyl rubber and a polynorbornene. Of these, one having a relative low molecular weight is likely to satisfy the inventive element, but is not limited in view of the components used.

The additives other than the described above can also give preferable properties to the cushion layer. These additives include a low melting point compound such as wax and a plasticizer such as phthalate, adipate, a glycol ester, a fatty acid ester, a phosphate, and chlorinated paraffin. Additives as described in "Purasuchikku oyobi gomu yo tenkazai jitsuyo binran", Kagaku Kogyosha (1970) can be used.

The addition amount of the additives may be an amount necessary to develop preferable properties with main components used in the cushion layer with no special limitations, but is preferably 10 weight %, more preferably 5 weight %, based on the total cushion layer weight.

The cushion layer is formed by dissolving or dispersing the compounds described above in a solvent and coating the resulting solution or dispersion on a support by means of a blade coater, a roller coater, a bar coater, a curtain coater or a gravure coater, or by hot-melt extrusion laminating.

The thickness of the cushion layer is preferably 10 $\mu$m or more, more preferably 20 $\mu$m or more, and still more preferably 20 to 180 $\mu$m. When an image is re-transferred onto another image receiving material (for example, coat paper or wood-free paper), the thickness of the cushion layer is preferably 30 $\mu$m or more.

The image receiving layer contains a binder resin and a matting agent, and optionally various additives.

The TMA softening point of the image receiving layer is preferably 70° C. or less, and more preferably 60° C. or less.

The resin used in the image receiving layer includes an adhesive such as a polyvinyl acetate emulsion type adhesive, a chloroprene emulsion type adhesive or an epoxy resin type adhesive, a tackifying agent such as a natural rubber, chloroprene rubber, butyl rubber, polyacrylate, nitrile rubber, polysulfide, silicone rubber or a petroleum resin, a reclaimed rubber, a vinylchloride resin, SBR, polybutadiene resin, polyisoprene, a polyvinyl butyral resin, polyvinyl ether, an ionomer resin, SIS, SEBS, an acryl resin, an ethylene-vinyl chloride copolymer, an ethylene-acryl copolymer, an ethylene-vinyl acetate resin (EVA), a vinyl chloride grafted EVA resin, an EVA grafted vinyl chloride resin, a vinyl chloride resin, various modified olefins and polyvinyl butyral.

The binder thickness of the image receiving layer is preferably 0.8 to 2.5 μm.

The image receiving layer in the invention preferably contains a matting agent. The number average particle size of the matting agent is preferably 1.5 to 5.5 μm larger than the average thickness of the layer in the absence of the matting agent, and the matting agent content of the image receiving layer is preferably 0.02 to 0.2 $g/m^2$. This content of the matting agent is preferable in keeping moderate adherence in a thin layer heat fusion transfer recording method comprising transfer recording of a thin layer colorant layer and particularly a heat mode transfer recording method.

It is preferable that the matting agent the number average particle size of which is 1.5 to 5.5 μm larger than the average thickness of the image receiving layer in the absence of the matting agent is contained in the image receiving layer in an amount of 70% or more.

A releasing layer may be provided between the image receiving layer and the cushion layer. The releasing layer is especially effective in re-transferring an image of the image receiving layer onto a final image receiving sheet.

The binder of the releasing layer includes polyester, polyvinyl acetal, polyvinyl formal, polyparabanic acid, polymethylmethacrylate, polycarbonate, ethylcellulose, nitrocellulose, methylcellulose, carboxymethylcellulose, hydroxypropylcellulose, polyvinyl alcohol, polyvinyl chloride, polystyrene, polyacrylo nitrile or their cross-linked polymers, a heat hardenable resin having a Tg of 60° C. or more such as polyamide, polyimide, polyetherimide, polysulfone, polyethersulfone or aramide or their hardened resin. The cross-linking agent includes a conventional one such as isocyanate or melamine.

The binder of the releasing layer is preferably polycarbonate, acetal, or ethylcellulose in view of storage stability, and it is more preferable that when an acryl resin is used in the image receiving layer, releasing is excellent in re-transferring an image transferred after a laser heat transfer method.

Further, a layer whose adhesiveness to the image receiving layer is poor in cooling can be used as a releasing layer. Such a layer is, for example, a layer containing a heat fusible compound such as waxes or a thermoplasticizer.

The heat fusible compound includes compounds disclosed in Japanese Patent O.P.I. Publication No. 63-193886, and microcrystalline wax, paraffin wax or carnauva wax is preferably used. As the thermoplasticizer, an ethylene copolymer such as ethylene-vinyl acetate copolymer or a cellulose resin is preferably used.

As an additive, a higher fatty acid, a higher alcohol, a higher fatty acid ester, an amide or a higher amine is optionally added to the releasing layer.

Another releasing layer is a layer which is melted or softened while heating, resulting in cohesive failure and is released. Such a layer preferably contains a supercooling agent. The supercooling agent includes poly-ε-caprolactam, polyoxyethylene, benzotriazole, tribenzylamine and vanillin.

Still another releasing layer may contain a compound lowering adhesiveness to the image receiving layer. The compound includes a silicone resin such as silicone oil, a fluorine-containing resin such as teflon or a fluorine-containing acryl resin or a polysiloxane resin, an acetal resin such as polyvinyl butyral, polyvinyl acetal, polyvinyl formal, solid wax such as polyethylene wax or amide wax, a fluorine-containing surfactant and a phosphate surfactant.

The releasing layer is formed by dissolving or dispersing the compounds described above in a solvent and coating the resulting solution or dispersion on the cushion layer by means of a blade coater, a roller coater, a bar coater, a curtain coater or a gravure coater, or by hot-melt extrusion laminating. Further, the releasing layer can be formed by coating the resulting solution or dispersion on a temporary support, laminating the coated on the cushion layer, and then peeling the temporary support.

The thickness of the releasing layer is preferably 0.3 to 3.0 μm. When the releasing layer is too thick, property of the cushion layer is difficult to develop, and the thickness need be adjusted according to kinds of the releasing layer.

<Recording material>

The image receiving material of the invention can be used as an image receiving material receiving an image of a recording material for heat fusible transfer employing a conventional thermal head or electric head. It is especially effective when the image receiving material is employed for a thin layer heat fusion transfer recording comprising transfer recording of a 1.5 μm or less colorant layer. The image receiving material of the invention can minimize transfer failure due to foreign matter which is a problem in a thin layer heat fusion transfer recording.

The thin layer heat transfer recording layer can be provided on a support for a conventional heat transfer recording. The support is preferably a smooth plastic film having a thickness of 5 to 25 μm the rear surface of which is subjected to releasing treatment.

The recording material is preferably a heat mode type thermal transfer recording material comprising a light-heat converting layer.

The heat mode type thermal transfer recording material has a colorant layer having a light-heat converting property or a colorant layer and a light-heat converting layer, on a support and optionally has a cushion layer or a releasing layer between the above layer and the support.

The support of the recording material is the same as denoted in the image receiving material. When an image is formed by exposing to a laser light from the recording material side, the support of the recording material is preferably transparent. When an image is formed by exposing to a laser light from the image receiving material side, the support of the recording material need not be transparent. The heat mode recording material is preferably thinner than the image receiving layer in view of easiness of superposing.

The colorant layer is a layer which contains a colorant and a binder and is melted or softened while heating to be transferred to another sheet, although the layer need not be completely melted to transfer.

The colorant includes inorganic pigment (for example, titanium dioxide, carbon black, graphite, zinc oxide, oprussian blue, cadmium sulfate, iron oxide and a chromate of lead, zinc or barium), organic pigment (for example, azo compounds, indigo compounds, anthraquinone compounds, anthanthrone compounds, triphenedioxazine compounds, vat dye pigment, phthalocyanine pigment or its derivative, and quinacridone pigment) and dyes (for example, direct dyes, dispersion dyes, oil soluble dyes, metal-containing oil soluble dyes and sublimable dyes). For example, as pigment for a color proof, C.I. 21095 or C.I. 21090 is used as a yellow pigment, C.I. 15850:1 as a magenta pigment, and C.I. 74160 as a cyan pigment.

The colorant content of the colorant layer may be adjusted in such a manner that an intended content can be obtained based on the intended coating thickness, and not specifically limited. The colorant content of the colorant layer is ordinarily 5 to 70% by weight, and preferably 10 to 60% by weight.

The binder of the colorant layer includes a heat fusible compound, a heat softening compound, and a thermoplastic resin. The heat fusible compound is a solid or semi-solid compound having a melting point of 40° to 150° C., the melting point measured by means of a melting point apparatus, Yanagimoto JP-2, and includes waxes, for example, vegetable wax such as carnauba wax, Japan wax, or esparto wax,, animal wax such as bees wax, insect wax, shellac wax or spemaceti, petroleum wax such as paraffin wax, microcrystalline wax, polyethylene wax, ester wax or acid wax, and mineral wax such as montan wax, ozocerite or ceresine. The binder further includes a higher fatty acid such as palmitic acid, stearic acid, margaric acid or behenic acid, a higher alcohol such as palmityl alcohol, stearyl alcohol, behenyl alcohol, margaryl alcohol, myricyl alcohol or eicosanol, a higher fatty acid ester such as cetyl palmitate, myricyl palmitate, cetyl stearate or myricyl stearate, an amide such as acetoamide, propionic amide, stearic amide or amide wax, and a higher amine such as stearyl amine, behenylamine or palmityl amine.

The thermo plasticizer includes resins such as an ethylene copolymer, a polyamide resin, a polyester resin, a polyethylene resin, a polyurethane resin, a polyoleffin resin, an acryl resin, a polyvinyl chloride resin, a cellulose resin, a rosin resin, a polyvinyl alcohol resin, a polyvinyl acetal resin, an ionomer resin or a petroleum resin; elastomers such as natural rubber, styrene-butadiene rubber, isoprene rubber, chloroprene rubber or a diene copolymer; rosin derivatives such as ester gum, a rosin-maleic acid resin, a rosin phenol resin or a hydrogenated rosin; a phenol resin, terpenes, a cyclopentadiene resin or aromatic hydrocarbon resins.

The thermal transfer layer having an intended softening or melting point can be obtained by suitably using the above described heat fusible compound or thermo plasticizer.

As disclosed in Japanese Patent O.P.I. Publication No. 62-108092, the uniforming the particle size of colorants can give high image density, but various additives can be used in order to secure colorant dispersion property or to obtain excellent color reproduction.

The additives include a plasticizer for increasing sensitivity by plasticizing the colorant layer, a surfactant for improving coatability, and a matting agent having a submicron to millimicron order particle size for minimizing blocking.

The coating thickness of the colorant layer is preferably 0.2 to 2 $\mu$m, and more preferably 0.3 to 1.5 $\mu$m. The thickness of not more than 0.8 $\mu$m gives high sensitivity, but the optimum thickness is selected according to balance between sensitivity and resolution or an intended image reproduction, since the transferability of the colorant layer is different from kinds of the binders used or their combination use ratio.

When the light-heat converting agent is added to the colorant layer, a light-heat converting layer is not necessary. When the light-heat converting agent is not transparent, the light-heat converting layer is preferably provided separate from the colorant layer in view of color reproduction of a transferred image. The light-heat converting layer can be provided closest to the colorant layer.

The light-heat converting compound is preferably a compound which absorbs light and effectively converts to heat, although different due to a light source used. For example, when a semi-conductor laser is used as a light source, a compound having absorption in the near-infrared light region is used. The near-infrared light absorbent includes an inorganic compound such as carbon black, an organic compound such as a cyanine, polymethine, azulenium, squalenium, thiopyrylium, naphthoquinone or anthraquinone dye, and an inorganic metal complex of phthalocyanine, azo or thioamide type. Exemplarily, the near-infrared light absorbent includes compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds can be used singly or in combination of two or more kinds thereof.

As the binder of the light-heat converting layer are used resins having high Tg and high heat conductivity. The binder includes resins such as polymethylmethacrylate, polycarbonate, polystyrene, ethylcellulose, nitrocellulose, polyvinylalcohol, polyvinyl chloride, polyamide, polyimide, polyetherimide, polysulfone, polyethersulfone, and aramide.

A water soluble polymer can be also used in the light-heat converting layer. The water soluble polymer is preferable because it gives excellent peelability between the colorant layer and the light-heat converting layer, has high heat resistance while irradiating light, restrains scatter or abrasion of the light-heat converting layer when excessive heat is applied. When the water soluble polymer is used, it is preferable that the light-heat converting compound is water soluble (by incorporation of a sulfo group to the compound) or dispersed in water. The addition of a releasing agent to the light-heat converting layer can give excellent peelability between the colorant layer and the light-heat converting layer and can improve sensitivity. The releasing agent includes a silicone releasing agent (for example, a polyoxyalkylene modified silicone oil or an alcohol modified silicone oil), a fluorine-containing surfactant (for example, a perfluoro phosphate surfactant, and other variopus surfactants.

The thickness of the light-heat converting layer is preferably 0.1 to 3 $\mu$m, and more preferably 0.2 to 1 $\mu$m. The light-heat converting compound content of the light-heat converting layer can ordinarily be determined in such a manner that the layer gives an optical density of preferably 0.3 to 3.0, more preferably 0.7 to 2.5 to light wavelength emitted from a light source used. When carbon black is used in the light-heat converting layer and the light-heat converting layer thickness is more than 1 $\mu$m, scorching due to excessive heating does not occurs but sensitivity tends to be lowered. However, the thickness of the light-heat converting layer is optionally selected due to power of a laser used or the optical density of the light-heat converting layer.

When the light-heat converting layer is poor in adhesiveness to a support, color mixture due to layer separation is likely to occur in peeling the recording material from an image receiving layer after heat transfer. Therefore, an adhesive layer may be provided between the support and the light-heat converting layer.

A conventional adhesive such as polyester, urethane or gelatin may be used in the adhesive layer. Further, in order to obtain the above effect, a cushion layer containing a tackifying agent or an adhesive may be provided instead of the adhesive layer.

As the light-heat converting layer, an evaporation layer may be used. The evaporation layer includes an evaporation layer of carbon black or metal black such as gold, silver, aluminum, chrome, nickel, antimony, tellurium, bismuth, or selenium. The light-heat converting compound may be a colorant itself in the colorant layer and as the light-heat converting compound, various other compounds may be used without being limited to the above described compounds.

The cushion layer is provided in order to increase adhesiveness between the recording layer and the image receiving layer. As the cushion layer is used a heat softening or elastic layer, which contains a compound capable of being sufficiently softened and deformed by heating, a compound with low elasticity or a compound with elastic property. The example of the compound includes the same compound as denoted in the cushion layer of the image receiving material.

The cushion layer is provided by means of a coating method, a lamination method or adhesion of a film in order to obtain the appropriate thickness. The cushion layer may be provided by the coating method in order to obtain the surface smoothness.

The cushion layer may be provided in the same manner as the cushion layer of the image receiving material. As a special cushion layer, a layer having a void structure obtained by forming a thermo softening or thermoplastic resin can be used. When a cushion layer requiring a smooth surface is further provided, various coating methods are preferably carried out. The total thickness of the cushion layer is preferably 2 to 10 μm, and more preferably 4 to 7 μm.

In a light-heat converting heat mode recording method, after the recording material is superposed on the image receiving layer so that the recording layer surface faces the surface of the image receiving layer, exposure is carried out from the support of the recording material or from the image receiving material.

When exposure is carried out from the support of the recording material, the image receiving layer and/or the cushion layer preferably contains a heat absorbing colorant so that the layers absorb any heat which the recording material can not completely absorb. This is useful for effectively employing heat or improving transferability.

In the latter case, in order for the colorant layer to effectively absorb a light source emitting energy, the image receiving material has a transmittance of preferably 70% or more, and more 80% or more to the light from the light source. For the purpose of the above, a transparent support or a transparent cushion layer is used, and at the same time, reflection of the back coat surface of the support or the interface between the support and the cushion layer needs to be minimized. In order to minimize reflection of the interface between the support and the cushion layer, the refractive index of the cushion layer is preferably at least 0.1 smaller than that of the support.

It is in the heat mode recording method, which comprises bringing the image receiving layer in close contact with the image recording material by vacuum and then recording, that the image receiving material of the invention gives the most effective results.

The surface of the back coat layer has a suction pressure of 300 mmHg or more, which results in increased adherence of the image receiving material to the carrying member, no displacement in overprinting for full color reproduction and increased recording sensitivity due to close contact between the image receiving layer and the image recording material, and easily removes gas generated by excessive heat caused by contact failure due to foreign matter.

EXAMPLES

The invention will be explained by the following examples to which the embodiments of the invention are not limited. In the examples, "parts" is parts by weight, unless otherwise specified.

Example 1

(Preparation of recording material 1)

The following coating solution was coated by means of a reverse roll coater on a 100 μm thick polyethylene terephthalate (PET) film support (T-100G, #100 made by Diafoil Hoechst Co.) and dried to give an intermediate layer having a dry thickness of 6 μm.

Intermediate layer coating solution

Styrene/ethylene/butadiene/styrene resin 14 parts (Kraiton G1657, made by Shell Chemical Co.)

Tackifier 6 parts (Super ester A100, made by Arakawa Chemical Co.)

Methylethylketone 10 parts

Toluene 80 parts

The following coating solution was coated by means of a wire bar coating method on a 25 μm thick PET film support (T-100G, #25 made by Diafoil Hoechst Co.) and dried to obtain a light-heat converting layer having a 830 nm wavelength transmittance of 0.83. The dry coating weight of the light-heat converting layer was 0.55 $g/m^2$.

Light-heat converting layer coating solution

Polyvinyl alcohol 10% aqueous solution 6.7 parts (Gosenol EG30, made by Nihongosei Chemical Co.)

Carbon Black dispersion 0.9 parts (Solid content: 30%, SD-9020, made by Dainihon Ink Co.)

Water 0.6 parts

Isopropyl alcohol 1.8 parts

The light-heat converting layer was laminated on the cushion layer by rollers, and the 25 μm thick PET film was peeled from the resulting material to obtain a recording sheet having PET (T-100G, #100)/cushion layer/light-heat converting layer.

Each of the following colorant layer coating solutions was coated by means of a wire bar coating method on the light-heat converting layer of the recording sheet and dried. Thus, four recording sheets, which had a yellow colorant layer, a magenta colorant layer, a cyan colorant layer and a black colorant layer, respectively, were obtained.

Colorant layer coating solution (Yellow)

Yellow pigment dispersion 1 16.9 parts (MHI Yellow #625, Pigment content: 10 wt %, average particle size: 0.15 μm, made by Mikuni Sikiso Co.)

Yellow pigment dispersion 2 1.9 parts (MHI Yellow #340, Pigment content: 10 wt %, average particle size: 0.5 μm, made by Mikuni Sikiso Co.)

Styrene-acryl resin 2.4 parts (Heimer SBM 73F, made by Sanyo Kasei Co.)

Ethylene-vinyl acetate copolymer 0.2 parts (EV-40Y, made by Mitsui DuPont Chemical Co.)

Fluorine-containing surfactant 0.1 parts (Serflon S-382, made by Asahi Glass Co.)

Methylethylketone 48.1 parts

Cyclohexanone 30.4 parts

The dry thickness of the yellow colorant layer was 0.55 μm.

Colorant layer coating solution (Magenta)

Magenta pigment dispersion 12 parts (MHI Magenta #1038, Pigment content: 15 wt %, average particle size: 0.16 μm, made by Mikuni Sikiso Co.)

Styrene-acryl resin 2.4 parts (Heimer SBM 73F, made by Sanyo Kasei Co.)

Ethylene-vinyl acetate copolymer 0.2 parts (EV-40Y, made by Mitsui DuPont Chemical Co.)

Fluorine-containing surfactant 0.1 parts (Serflon S-382, made by Asahi Glass Co.)

Methylethylketone 60.5 parts

Cyclohexanone 24.8 parts

The dry thickness of the magenta colorant layer was 0.56 μm.

Colorant layer coating solution (Cyan)

Cyan pigment dispersion 5.1 parts (MHI Cyan #454, Pigment content: 30 wt %, average particle size: 0.14 μm, made by Mikuni Sikiso Co.)

Styrene-acryl resin 2.9 parts

Ethylene-vinyl acetate copolymer 0.2 parts (EV-40Y, made by Mitsui DuPont Chemical Co.)

Fluorine-containing surfactant 0.1 parts (Serflon S-382, made by Asahi Glass Co.)

Methylethylketone 50.3 parts

Cyclohexanone 42 parts

The dry thickness of the cyan colorant layer was 0.54 μm.

Colorant layer coating solution (Black)

Black pigment dispersion 4.9 parts (MHI Black #220, Pigment content: 33 wt %, average particle size: 0.13 μm, made by Mikuni Sikiso Co.)

Cyan pigment dispersion (described above) 0.9 parts

Violet pigment dispersion 1.2 parts (MHI Violet #735, Pigment content: 10 wt %, average particle size: 0.38 μm, made by Mikuni Sikiso Co.)

Styrene-acryl resin 3.9 parts (Heimer SBM73F, made by Sanyo Kasei Co.)

Ethylene-vinyl acetate copolymer 0.3 parts (EV-40Y, made by Mitsui DuPont Chemical Co.)

Fluorine-containing surfactant 0.1 parts (Serflon S-382, made by Asahi Glass Co.)

Methylethylketone 57.9 parts

Cyclohexanone 30.8 parts

The dry thickness of the black colorant layer was 0.72 μm.

(Preparation of image receiving material)

The acryl type latex (Yodosol AD92K, made by Kanebo NSC Co.) was coated by means of an applicator wire on a 100 μm thick PET film (T-100 described previously) and dried to obtain a cushion layer having a dry thickness of 30 μm. The following releasing layer coating solution was coated by a wire bar coating method on the cushion layer and dried to obtain a releasing layer having a dry thickness of 1.7 μm.

Releasing layer coating solution

Ethylcellulose 10parts (Ethocel 10, made by Dow Chemical Co.)

Isopropyl alcohol 90 parts

Thereafter, the following image receiving layer coating solution was coated by a wire bar coating method on the releasing layer and dried to obtain an image receiving layer having a dry thickness of 1.5 μm. Thus, an image receiving material was obtained.

Image receiving layer coating solution

Polyacrylic acid latex 25 parts (Yodosol A5805, made by Kanebo NSC Co.)

Matting agent 39 wt % aqueous dispersion 1.8 parts (MX-40S*, made by Soken Kagaku Co.)

Fluorine-containing resin 4.2 parts (Sumirese Resin FP-150, made by Sumitomo Kagaku Co.)

Isopropyl alcohol 9 parts

Water 60 parts

*PMMA particles having an average particle size of 4.1 μm according to a SEM observation.

(Preparation of back coat layer)

Each of the following back coat layer compositions was coated on the surface of the PET film opposite the image receiving layer of the above obtained image receiving material. Thus, image receiving material sample Nos. 1 through 7 were obtained.

Back coat layer composition 1 (Example)

Polyvinyl alcohol 10% aqueous solution 8.1 parts (Gosenol EG30, described previously)

Melamine resin 0.8 parts (Sumirese Resin 613, made by Sumitomo Kagaku Co.)

Amine salt 0.1 parts (Sumirese Resin ACX-P, made by Sumitomo Kagaku Co.)

Fluorine-containing resin 0.5 parts (Sumirese Resin FP-150, described previously)

Matting agent 10 wt % aqueous dispersion 0.5 parts (Silicia 470*, made by Fuji Silicia Kagaku Co.)

* Silicia 470 is synthetic silica particles having an average particle size of 12 μm according to a Coulter counter method and ($\sigma/r_n$ of 0.65.

After coating, the sample was dried for 10 minutes in a 100° C. thermostat and hardened to give a back coat layer having a dry thickness of about 2 μm.

Back coat layer composition 2 (Comparative Example)

Polyvinyl alcohol 10% aqueous solution 56.4 parts (Gosenol EG30, described previously)

Matting agent 10 wt % aqueous dispersion 3.6 parts (PMMA particles* prepared by a water emulsification method)

Water 40parts

* PMMA particles had an average particle size of 5.6 μm according to a Coulter counter method and $\sigma/r_n$ of 0.2, and had 20 wt % of 8 μm or more particles.

The dry thickness of the back coat layer was 0.4 μm, and the back coat layer contains 8 μm or more particles in an amount of 4.2 $mg/m^2$.

Back coat layer composition 3 (Example)

Polyvinyl alcohol 10% aqueous solution 56.4 parts (Gosenol EGOS, described previously)

Matting agent dispersion 3.6 parts (the same as in the same as in the above back coat layer composition 2)

Water 40 parts

The dry thickness of the back coat layer was 0.6 μm, and the back coat layer contains 8 μm or more particles in an amount of 7.2 $mg/m^2$.

Back coat layer composition 4 (Example)

Polyvinyl alcohol 10% aqueous solution 56.4 parts (Gosenol EG05, described previously)

Matting agent dispersion 3.6 parts (MX-1000*, made by Soken Kagaku Co.)

Water 40 parts

* MX-1000 had an average particle size of 10 μm and $\sigma/r_n$ of 0.099 according to a SEM observation.

The dry thickness of the back coat layer was 0.6 μm.

Back coat layer composition 5 (Example)

Polyvinyl alcohol 10% aqueous solution 78 parts (Gosenol EG30, described previously)

Fluorine-containing resin 3 parts (Sumirese Resin FP-150, described previously)

Paraffin sodium sulfonate solution 3 parts (Efkol 214, made by Matsumoto Yusi Co.)

MX-1500 10 wt % aqueous dispersion 16 parts (MX-1500, described previously)

The sample was dried for 10 minutes in a 100° C. thermostat to give a back coat layer having a dry thickness of about 2.5 μm.

Back coat layer composition 6 (Example)

Polyvinyl alcohol 10% aqueous solution 56.4 parts (Gosenol EG30, described previously)

MX-1000 10 wt % aqueous dispersion 3.6 parts (MX-1000 described previously)

Aqueous carbon black dispersion 2.5 parts (CB 5264, made by Mikuni Sikiso Co.)

Water 37.5 parts

Fluorine-containing resin 0.5 parts (Sumirese Resin FP-150, described previously)

The back coat layer had a dry thickness of about 0.5 μm.

Back coat layer composition 7 (Example)

Polyvinyl alcohol 10% aqueous solution 74 parts (Gosenol EG30, described previously)

Melamine resin 2 parts (Sumirese Resin 613, made by Sumitomo Kagaku Co.)

Amine salt 8 parts (Sumirese Resin ACX-P, made by Sumitomo Kagaku Co.)

MX-1500 10 wt % aqueous dispersion 14 parts (MX-1500 described previously)

The back coat layer had a dry thickness of about 2.2 μm.

Image receiving material sample 8 (Comparative Example)

The following cushion and image receiving layer coating solutions were coated by means of a wire bar on a PET film (T-100 described previously) in that order and dried.

Cushion layer coating solution

Ethylene-vinyl acetate resin 27 parts (EV-40Y described previously)

Anti-static agent 3 parts (MHY Black #236, made by Mikuni Sikiso Co.)

Toluene 55 parts

Isopropyl alcohol 15 parts

The dry thickness of the cushion layer was 25 μm.

Image receiving layer coating solution

Graftmer E 2 parts (vinyl chloride grafted ethylene-vinyl acetate copolymer, made by Nihon Zeon Co.)

Styrene-acryl resin 3 parts (Heimer SBM 100 described previously)

Methylethyl ketone 71.25 parts

Cyclohexanone 23.75 parts

The dry thickness of the image receiving layer was 1.2 μm.

Using the above obtained recording material, an image was transferred onto the image receiving material samples obtained above.

(Image formation by laser thermal transfer)

Figure 2:
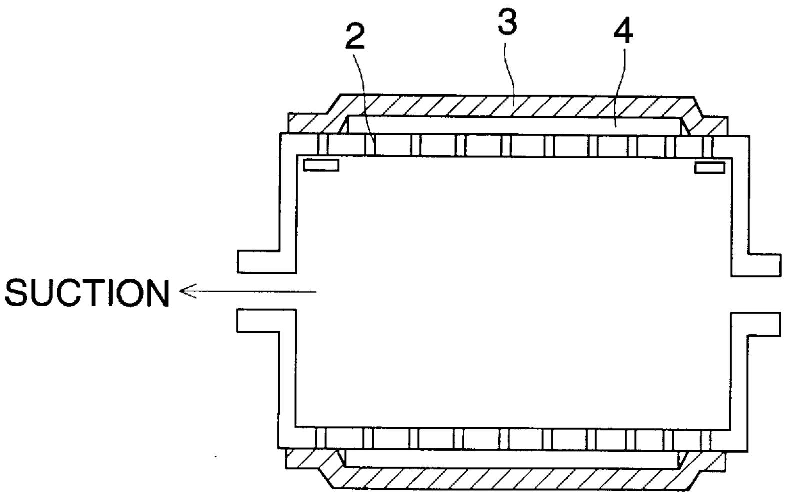
FIG. 2 shows a sectional view of the suction drum.

An image was formed employing the experimental apparatus shown in FIGS. 1 and 2. Image receiving material 4 was wound around the drum having suction holes 2 so that the back coat layer contacted the drum. Thereafter, the recording material 3 was superposed on the image receiving material 4 so that the image receiving layer contacted the colorant layer of the recording material, and sucked by the suction holes. A laser light was irradiated from the support of the recording material to transfer a formed image onto the image receiving layer, using LT090 MD/MF (wavelength: 830 nm, maximum output: 100 mW) produced by Sharp Co., Ltd.. During laser irradiation, fibers having a diameter of 20 μm were interposed between the drum and the image receiving layer and a 40 μm, 1 $mm^2$ tape was interposed between the recording material and the image receiving layer.

(Image transfer by lamination)

Printing paper (Tokubishi Art, made by Mitsubishi Seishi Co., Ltd.) was superposed on the image receiving layer having the transferred image, and the image was retransferred onto the printing paper by a 150° C. roller at a pressure of 2 kg and at a roller circumferential speed of 20 mm/second. The transferred image was evaluated according to the following criteria.

The results are shown in Table 1.

Evaluation 1: Effects of foreign matter of the back coat of the image receiving material <<Fog>>

Irradiation was carried out through an original of a 50% dot pattern image, and the transferred image at unexposed portions was visually observed and evaluated as fog. Evaluation was carried out according to the following criteria:

A: No fog was observed.

B: Fog of not more than 2 mm was observed.

C: Fog of not less than 5 mm was observed.

<<Air removing failure>>

Pressure was applied from the back coat layer of the image receiving material and evaluated for defects according to the following criteria:

A: No defects were observed.

B: Defects of not more than 5 mm were observed.

C: Defects of not less than 1 cm were observed.

Evaluation 2: Effects by foreign matter between the image receiving material and the recording material <<Transfer Failure>>

Whether or not an image to be transferred was transferred to the image receiving layer was visually observed, and evaluation was carried out according to the following criteria:

A: The untransferred image area was greater than the size of the foreign matter by not more than 20 μm.

B: The untransferred image area was greater than the size of the foreign matter by 20 to 50 μm.

C: The untransferred image area was greater than the size of the foreign matter by not less than 50 μm.

<<Scorching>>

Stains on the transferred image caused due to scorching of the light heat converting layer of the recording material was visually observed, and evaluated according to the following criteria:

A: No scorching was observed.

B: Slight scorching was observed.

C: Scorching was observed, and no color reproduction was obtained.

TABLE 1

| Image receiving material sample No. | Smoothter Value | Fog | Air removing failure | Transfer Failure | Scorching |
|---|---|---|---|---|---|
| 1 Example | 350 mmHg | B | B | A | B |
| 2 Comparative | 270 mmHg | B | A | C | B |
| 3 Example | 340 mmHg | A | A | A | A |
| 4 Example | 400 mmHg | A | A | A | A |
| 5 Example | 420 mmHg | A | A | A | A |
| 6 Example | 390 mmHg | A | A | A | A |
| 7 Example | 430 mmHg | A | A | A | A |

The suction pressure of the back coat layer surface in each image receiving material was measured by a smoothter SM-6B made by Toei Denkikogyo Co. The measurement was carried out after each sample had been stored for 2 hours at 23° C. and 52% RH.

Next, anti-static property was evaluated. Regarding image receiving material sample Nos. 1, 6, 7 and 8, each of a NBR rubber roller, phenol resin roller and silicone rubber roller was rolled on the image receiving layer for ten back and forth cycles, where each cycle consisted of one forward stroke and an equal backward stroke, and frictionally charged. A cigarette ash test (Marumo Hideo, "Taidenboshi zai-Kobunshi no Hyomenkaishitu", page 150, published on Mar. 25, 1972) well known as a method to measure dust adherence property was carried out. The charged surface was gradually approached to the cigarette ash and the distance at which the cigarette ash was attracted was measured.

Each image receiving material, the rollers used and the cigarette ash was stored at 23° C. and 23% RH for 24 hours, and then evaluation was carried out under the same conditions.

A: Even when the charged surface was not more than 1 cm from the cigarette ash, the ash was not attracted.

B: When the charged surface was not more than 3 cm from the cigarette ash, the ash was attracted.

C: When the charged surface was about 10 cm from the cigarette ash, the ash began to be attracted.

The specific surface resistance of the back coat layer and image receiving layer of each image receiving material sample was measured after each sample was stored for 2 hours at 23° C. and 52% RH. The results are shown in Table 2.

TABLE 2

Image receiving layer surface

| Image receiving material sample No. | Specific surface resistance | Cigarette ash test: NBR rubber | Cigarette ash test: phenol resin | Cigarette ash test: silicone rubber |
|---|---|---|---|---|
| 1 Example | $2.5 \times 10^{12}$ Ω/cm$^2$ | B | C | C |
| 5 Example | $1.8 \times 10^{9}$ Ω/cm$^2$ | A | A | B |
| 6 Example | $1.5 \times 10^{5}$ Ω/cm$^2$ | A | A | A |
| 7 Example | $0.3 \times 10^{9}$ Ω/cm$^2$ | A | A | A |
| 8 Comparative | $9.5 \times 10^{10}$ Ω/cm$^2$ | B | B | C |

Back coat layer surface

| Image receiving material sample No. | Specific surface resistance | Cigarette ash test: NBR rubber | Cigarette ash test: phenol resin | Cigarette ash test: silicone rubber |
|---|---|---|---|---|
| 1 Example | $4.8 \times 10^{11}$ Ω/cm$^2$ | B | B | C |
| 5 Example | $1.0 \times 10^{9}$ Ω/cm$^2$ | A | A | B |
| 6 Example | $9.2 \times 10^{8}$ Ω/cm$^2$ | A | A | A |
| 7 Example | $8.9 \times 10^{8}$ Ω/cm$^2$ | A | A | A |
| 8 Comparative | $1.3 \times 10^{10}$ Ω/cm$^2$ | A | B | C |

Example 2

(Preparation of recording material 2)

The colorant layer coating solutions in recording material 1 of Example 1 were coated in order by means of a wire bar coater on a 6 μm thick PET film support (made by Diafoil Hoechst Co.) the rear surface of which was subjected to releasing treatment and dried. Thus, recording material 2, which had a 0.48 μm yellow layer, a 0.50 μm magenta layer, a 0.48 μm cyan layer and a 0.57 μm black layer, was obtained.

(Image forming by thermal transfer)

Image receiving material sample Nos. 11 through 17 were prepared in the same manner as in image receiving material sample Nos. 1 through 7 of Example 1, respectively, except that a 125 μm thick white PET film (W-400, made by Diafoil Hoechst Co.) was used instead of T-100. Thermal image transfer recording was carried out in the same manner as in Example 1, except for employing a thermal head printer (S-600, made by Mitsubishi Denki Co.), and a combination of the above prepared recording material and image receiving material samples. Transfer failure was evaluated in the same manner as in Example 1. The results are shown in Table 3.

TABLE 3

| Image receiving material sample No. | Smoothter Value | Transfer Failure |
|---|---|---|
| 11 Example | 310 mmHg | A |
| 12 Comparative | 250 mmHg | C |
| 13 Example | 320 mmHg | A |
| 14 Example | 390 mmHg | A |
| 15 Example | 400 mmHg | A |
| 16 Example | 390 mmHg | A |
| 17 Example | 430 mmHg | A |

As is apparent from Table 3, the inventive samples are excellent.

What is claimed is:

1. A thermal transfer image receiving material comprising:

a support having a first surface and a second surface;

a cushion layer and an image receiving layer provided on the first surface in that order; and a back coat layer provided on the second surface, wherein the surface of the backcoat layer has a suction pressure of 300 mmHg or more; and the surface specific resistance of the back coat layer is $2\times10^9$ Ω/cm$^2$ or less.

2. A thermal transfer image receiving material comprising:

a support having a first surface and a second surface;

a cushion layer and an image receiving layer provided on the first surface in that order; and a back coat layer provided on the second surface, wherein the surface of the back coat layer has a suction pressure of 300 mmHg or more; and wherein the image receiving layer contains a matting agent.

3. The thermal transfer image receiving material of claim 1 or claim 2, wherein the back coat layer contains a binder resin and a matting agent.

4. The thermal transfer image receiving material of claim 3, wherein the number average particle size of the matting agent is not less than 2.5 μm larger than the thickness of the back coat layer containing only a binder resin.

5. The thermal transfer image receiving material of claim 3, wherein the back coat layer contains a matting agent having a particle size of 8 μm or more in an amount of 5 mg/m$^2$ or more.

6. The thermal transfer image receiving material of claim 3, wherein the matting agent has ($\sigma/r_n$ of 0.3 or less, $\sigma$ representing standard deviation of the matting agent particle size and $r_n$ the number average particle size of the matting agent.

7. The thermal transfer image receiving material of claim 1, wherein the back coat layer contains carbon black and a metal oxide.

8. The thermal transfer image receiving material of claim 1 or claim 2, wherein the softening point of the cushion layer and image receiving layer is 70° C. or less, the softening point being measured according to a TMA method.

9. The thermal transfer image receiving material of claim 2, wherein the number average particle size of the matting agent contained in the image receiving layer is 1.5 to 5.5 μm larger than the average thickness of portions containing no matting agent in the image receiving layer.

10. The thermal transfer image receiving material of claim 2, wherein the image receiving layer contains a matting agent in an amount of 0.02 to 0.2 $g/m^2$.

11. The thermal transfer image receiving material of claim 1 or claim 2, wherein the binder thickness of the image receiving layer is 0.8 to 2.5 μm.

12. The thermal transfer image receiving material of claim 1 or claim 2, wherein the image receiving layer receives an image from a heat mode recording material comprising a support and provided thereon, a light-heat converting layer and a colorant layer.

* * * * *